(12) United States Patent
Furukawa et al.

(10) Patent No.: US 7,820,502 B2
(45) Date of Patent: Oct. 26, 2010

(54) METHODS OF FABRICATING VERTICAL CARBON NANOTUBE FIELD EFFECT TRANSISTORS FOR ARRANGEMENT IN ARRAYS AND FIELD EFFECT TRANSISTORS AND ARRAYS FORMED THEREBY

(75) Inventors: Toshiharu Furukawa, Essex Junction, VT (US); Mark Charles Hakey, Fairfax, VT (US); Steven John Holmes, Guilderland, NY (US); David Vaolav Horak, Essex Junction, VT (US); Charles William Koburger, III, Delmar, NY (US); Peter H. Mitchell, Jericho, VT (US); Larry Alan Nesbit, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 11/926,627

(22) Filed: Oct. 29, 2007

(65) Prior Publication Data
US 2008/0044954 A1 Feb. 21, 2008

Related U.S. Application Data

(62) Division of application No. 10/777,576, filed on Feb. 12, 2004.

(51) Int. Cl.
*H01L 21/8238* (2006.01)
(52) U.S. Cl. .................. 438/199; 438/212; 438/268
(58) Field of Classification Search ............... 438/173, 438/192, 199, 206, 212, 268
See application file for complete search history.

(56) References Cited

U.S. PATENT DOCUMENTS 5,796,573 A 8/1998 Kotecki et al.

6,250,984 B1 6/2001 Jin et al.

(Continued)

FOREIGN PATENT DOCUMENTS

EP 1331671 A1 7/2003

(Continued)

OTHER PUBLICATIONS

"IBM Scientists Develop Carbon Nanotube Transistor Technology," IBM.com News, news report concerning work published in Science, vol. 292, Issue 5517, Apr. 27, 2001 entitled "Engineering Carbon Nanotubes and Nanotube Circuits Using Electrical Breakdown" by Avouris, et al. (3 pages).

(Continued)

*Primary Examiner*—Ori Nadav
(74) *Attorney, Agent, or Firm*—Wood, Herron & Evans, LLP

(57) ABSTRACT

A method for forming carbon nanotube field effect transistors, arrays of carbon nanotube field effect transistors, and device structures and arrays of device structures formed by the methods. The methods include forming a stacked structure including a gate electrode layer and catalyst pads each coupled electrically with a source/drain contact. The gate electrode layer is divided into multiple gate electrodes and at least one semiconducting carbon nanotube is synthesized by a chemical vapor deposition process on each of the catalyst pads. The completed device structure includes a gate electrode with a sidewall covered by a gate dielectric and at least one semiconducting carbon nanotube adjacent to the sidewall of the gate electrode. Source/drain contacts are electrically coupled with opposite ends of the semiconducting carbon nanotube to complete the device structure. Multiple device structures may be configured either as a memory circuit or as a logic circuit.

13 Claims, 12 Drawing Sheets

U.S. PATENT DOCUMENTS

| | | | |
|---|---|---|---|
| 6,423,583 B1 | 7/2002 | Avouris et al. | |
| 6,440,763 B1* | 8/2002 | Hsu | 438/20 |
| 6,515,325 B1* | 2/2003 | Farnworth et al. | 257/296 |
| 6,525,453 B2* | 2/2003 | Cheng et al. | 313/309 |
| 6,566,704 B2 | 5/2003 | Choi et al. | |
| 6,740,910 B2* | 5/2004 | Roesner et al. | 257/213 |
| 6,815,294 B2 | 11/2004 | Choi et al. | |
| 6,855,603 B2 | 2/2005 | Choi et al. | |
| 6,858,891 B2 | 2/2005 | Farnworth et al. | |
| 6,891,227 B2 | 5/2005 | Appenzeller et al. | |
| 6,979,947 B2* | 12/2005 | Yaniv et al. | 313/495 |
| 7,015,500 B2 | 3/2006 | Choi et al. | |
| 7,038,299 B2 | 5/2006 | Furukawa et al. | |
| 7,084,507 B2 | 8/2006 | Awano | |
| 7,211,844 B2 | 5/2007 | Furukawa et al. | |
| 2001/0025962 A1* | 10/2001 | Nakamoto | 257/137 |
| 2003/0209802 A1* | 11/2003 | Awano | 257/712 |
| 2003/0211724 A1* | 11/2003 | Haase | 438/629 |
| 2004/0027889 A1 | 2/2004 | Occhipinti et al. | |
| 2005/0056826 A1 | 3/2005 | Appenzeller et al. | |
| 2005/0129948 A1 | 6/2005 | Furukawa et al. | |
| 2005/0167755 A1 | 8/2005 | Dubin et al. | |

FOREIGN PATENT DOCUMENTS

| | | |
|---|---|---|
| EP | 1361608 A2 | 11/2003 |
| EP | 1420414 A1 | 11/2003 |
| EP | 1435660 A2 | 7/2004 |
| WO | 03063208 A2 | 7/2003 |
| WO | 2004040616 A2 | 5/2004 |
| WO | 2004040668 A2 | 5/2004 |
| WO | 2004105140 A1 | 12/2004 |

OTHER PUBLICATIONS

"Carbon Nanotube Arrays: Synthesis of Dense Arrays of Well-Aligned Carbon Nanotubes Completely Filled with Titanium Carbide on Titanium Substrates," Batelle No. 12132 (1 page).

Cao, et al., "Grapevine-like Growth of Single Walled Carbon Nanotubes Among Vertically Aligned Multiwalled Nanotube Arrays", Applied Physics Letters vol. 79, No. 9, Aug. 27, 2001 (pp. 1252-1254).

Chang, "Integration of Nanotubes into Devices", National Nanofabrication Users Network, Stanford Nanofabrication Facility, p. 58.

Choi, et al., "Ultrahigh-Density Nanotransistors by Using Selectively Grown Vertical Carbon Nanotubes", Applied Physics Letters, vol. 79, No. 22, Nov. 26, 2001, pp. 3696-3698.

Collins, et al., "Nanotubes for Electronics," Scientific American, Dec. 2000, pp. 62-69.

Collins, et al., "Engineering Carbon Nanotubes and Nanotube Circuits Using Electrical Breakdown," Science, vol. 292, Apr. 27, 2001, pp. 706-709.

Cui, et al., "Growth Behavior of Carbon Nanotubes on Multilayered Metal Catalyst Film in Chemical Vapor Deposition," Chemical Physics Letters 374 (2003), pp. 222-228.

Derycke, et al., "Carbon Nanotube Inter- and Intramolecular Logic Gates," Nano Letters, xxxx, vol. 0, No. 0, A-D, (4 pages).

Duesberg, et al., "Ways Toward the Scaleable Integration of Carbon Nanotubes into Silicon Based Technology", Diamond and Related Materials 13 (2004) pp. 354-361.

Duesberg, et al., "Large-Scale Integration of Carbon Nanotubes into Silicon Based Microelectronics", Proceedings of SPIE vol. 5118 (2003), pp. 125-137.

Gorman, "Nanoscale Networks: Superlong Nanotubes Can Form a Grid," Science News Online, week of May 3, 2003, vol. 163, No. 18. (3 pages).

Harris, "Carbon Nanotubes and Related Structures," Cambridge University Press, 1999 (pp. 15-60).

Huang, et al. "Growth of Highly Oriented Carbon Nanotubes by Plasma-Enhanced Hot Filament Chemical Vapor Deposition", Applied Physics Letters, vol. 73, No. 26, Dec. 28, 1998, pp. 3845-3847.

Jung, et al., "Growth of Carbon Nanotubes by Chemical Vapor Deposition", Diamond and Related Materials 10 (2001) pp. 1235-1240.

Kalaugher, "Tiny Nanotubes Set New Record," Nanotechweb.org, Aug. 7, 2003 (1 page).

Kiang, "Growth of Large-Diameter Single-Walled Carbon Nanotubes," J. Phys. Chem. A 2000, 104, 2454-2456.

Li, et al. "Highly-Ordered Carbon Nanotube Arrays for Electronics Applications," Applied Physics Letters, vol. 75, No. 3, Jul. 19, 1999, pp. 367-369.

Li, et al., "Bottom-Up Approach for Carbon Nanotube Interconnects," NASA Ames Research Center, received Dec. 5, 2002, accepted Jan. 31, 2003 (1 page).

Mo, et al, "The Growth Mechanism of Carbon Nanotubes from Thermal Cracking of Acetylene Over Nickel Catalyst Supported on Alumina," Synthetic Metals 122 (2001) pp. 443-447.

Ploenjes, et al., "Single-Walled Carbon Nanotube Synthesis in CO Laser Pumped Carbon Monoxide Plasmas," Ohio State University, Oct. 10, 2001 (1 page).

Plonjes, et al., "Synthesis of Single-Walled Carbon Nanotubes in Vibrationally Non-Equilibrium Carbon Monoxide," Chemical Physics Letters 352 (2002) pp. 342-347.

Popov, "Carbon Nanotubes: Properties and Application", Materials Science and Engineering R. vol. R43, No. 3, pp. 61-102, Jan. 15, 2004 (1 page).

Ren, et al., "Synthesis of Large Arrays of Well-Aligned Carbon Nanotubes on Glass," Science, vol. 282, Nov. 6, 1998, pp. 1105-1107.

Ren, et al., "Large Arrays of Well-Aligned Carbon Nanotubes," Proceedings of 13th International Winter School on Electronic Properties of Novel Materials, pp. 263-267, Feb. 27-Mar. 6, 1999, Kirchberg / Tirol, Austria.

Ren, et al., "Growth, Characterization, and Potential Applications of Periodic Carbon Nanotube Arrays," Department of Physics, Boston College, updated 2001 (2 pages).

Rueckes, et al., "Carbon Nanotube-Based Nonvolatile Random Access Memory for Molecular Computing", Science vol. 289, Jul. 7, 2000, pp. 94-97.

Teo, "Catalytic Synthesis of Carbon Nanotubes and Nanofibers," Encyclopedia of Nanoscience and Nanotechnology, vol. X, pp. 1-22, 2003.

Wind, et al., "Vertical Scaling of Carbon Nanotube Field-Effect Transistors Using Top Gate Electrodes," Applied Physics Letters, vol. 80, No. 20, May 20, 2002, pp. 3817-3819.

"Synthesis of CNT's," http://nepp.nasa.gov/index—nasa.cfm/769/#synthesis (7 pages).

Zhang, et al., "Electric-Field-Directed Growth of Aligned Single-Walled Carbon Nanotubes," Applied Physics Letters, vol. 79, No. 19, Nov. 5, 2001, pp. 3155-3157.

Zhao, et al., "Film Growth of Pillars of Multi-Walled Carbon Nanotubes," J. Phys.: Condens., Matter 15 (2003), L565-L569.

Zheng, et al., "Efficient CVD Growth of Single-Walled Carbon Nanotubes on Surfaces Using Carbon Monoxide Precursor," Nano Letters, xxxx, vol. 0., No. 0, A-D, xxxx American Chemical Society, revised Jun. 26, 2002, (3 pages).

Zhu, et al., "Direct Synthesis of Long Single-Walled Carbon Nanotube Strands," Science, vol. 296, May 3, 2002, pp. 884-886.

Ori Nadov, Notice of Allowance issued in related U.S. Appl. No. 10/777,576 dated Jun. 16, 2010.

\* cited by examiner

METHODS OF FABRICATING VERTICAL CARBON NANOTUBE FIELD EFFECT TRANSISTORS FOR ARRANGEMENT IN ARRAYS AND FIELD EFFECT TRANSISTORS AND ARRAYS FORMED THEREBY

CROSS-REFERENCE TO RELATED APPLICATIONS

This application is a divisional of application Ser. No. 10/777,576, filed Feb. 12, 2004, which is hereby incorporated by reference herein in its entirety.

FIELD OF THE INVENTION

The invention relates to semiconductor device fabrication and, more particularly, to methods of constructing vertical carbon nanotube field effect transistors and arrays thereof, and device structures and arrays of device structures formed by such methods.

BACKGROUND OF THE INVENTION

Traditional field effect transistors (FET's) are familiar conventional devices commonly incorporated as a fundamental building block into the intricate circuitry of integrated circuit (IC) chips. Downward scaling of FET dimensions has improved circuit performance and increased the functional capability of FET's packed on an IC chip. However, continued dimensional reductions may be hampered by the size limitations associated with traditional materials and the costs associated with lithographic patterning.

Carbon nanotubes are nanoscale high-aspect-ratio cylinders consisting of hexagonal rings of carbon atoms that may assume either a semiconducting electronic state or a conducting electronic state. A conventional method for synthesizing carbon nanotubes suitable for forming FET arrays utilizes a chemical vapor deposition (CVD) process. Specifically, the CVD process directs a flow of a carbonaceous reactant to a catalyst material located on the planar substrate, where the reactant is catalyzed to synthesize the carbon nanotubes. The carbon nanotubes grow and lengthen by insertion of activated carbon atoms at the interface with the catalyst material. The carbon nanotubes are then harvested for use in various end applications.

FET's have been successfully fabricated using a semiconducting carbon nanotube as a channel region and forming contacts at opposite ends of the semiconducting carbon nanotube extending between a gold source electrode and a gold drain electrode situated on the surface of a substrate. A gate electrode is defined in the substrate underlying the carbon nanotube and generally between the source and drain electrodes. An oxidized surface of the substrate defines a gate dielectric situated between the buried gate electrode and the carbon nanotube.

Nanotube FET's should switch reliably while consuming significantly less power than a comparable silicon-based device structure due to the small dimensions of the carbon nanotube. Such FET's have been successfully formed under controlled laboratory conditions by manipulating single semiconducting carbon nanotubes using an atomic force microscope for precision placement between the source and drain electrodes. Nanotube FET's have also been formed by coincidental placement of a single semiconducting carbon nanotube between the source and drain electrodes from among a randomly dispersed group of semiconducting carbon nanotubes.

Large arrays of FET's are demanded in the fabrication and mass production of IC chips. Conventional manipulation or coincidental placement of carbon nanotubes cannot satisfy the requirements for mass production. Unfortunately, as the carbon nanotubes lengthen, the flow of CVD reactant(s) to the catalyst material becomes restricted, which slows or even halts nanotube synthesis. In certain FET designs, the catalyst material may be located at the base of a high-aspect-ratio opening, which further restricts reactant flow.

What is needed, therefore, is a method of synthesizing an array of FET's incorporating carbon nanotubes compliant with mass production techniques and in which a CVD nanotube-synthesis process transpiring at a catalyst material integrated into the FET structure is not limited by reactant flow restrictions.

SUMMARY OF THE INVENTION

In accordance with the invention, a semiconductor device structure includes a gate electrode with a vertical sidewall covered by a gate dielectric and a semiconducting carbon nanotube extending vertically at a location adjacent to the vertical sidewall of the gate electrode. A source is electrically coupled with one end of the semiconducting carbon nanotube and a drain is electrically coupled with an opposite end of the semiconducting carbon nanotube. Multiple semiconductor device structures may be arranged in an array and interconnected together either as a memory circuit or as a logic circuit.

In another aspect of the invention, a method is provided for fabricating a device structure. The method includes forming a stacked structure including a plurality of catalyst pads each coupled electrically with a source contact, a gate electrode layer, and an insulating layer separating the gate electrode layer from the plurality of catalyst pads. The method further includes partitioning the stacked structure to define a plurality of gate electrodes in the gate electrode layer in which adjacent gate electrodes are separated by a reactant path and each of the plurality of catalyst pads is at least partially exposed to the reactant path at a location proximate a vertical sidewall of a corresponding one of the plurality of gate electrodes. At least one semiconducting carbon nanotube is synthesized on each of the plurality of catalyst pads with a chemical vapor deposition process that involves directing a reactant through the reactant path to each of the plurality of catalyst pads.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

The invention in its various embodiments provides methods for forming arrays of field effect transistors (FET's) incorporating semiconducting carbon nanotubes as a channel region and, optionally, conducting carbon nanotubes as a component of a gate contact and/or a source contact. Adjacent FET's are spaced apart such that, as the carbon nanotubes lengthen, the flow of CVD reactant(s) to a catalyst material supporting nanotube synthesis does not become restricted. Because the nanotube synthesis is unencumbered by significant flow restrictions, the carbon nanotubes may be grown at a higher rate to a greater length, and arrays of FET's may be formed by appropriate mass production techniques.

Figure 1A:
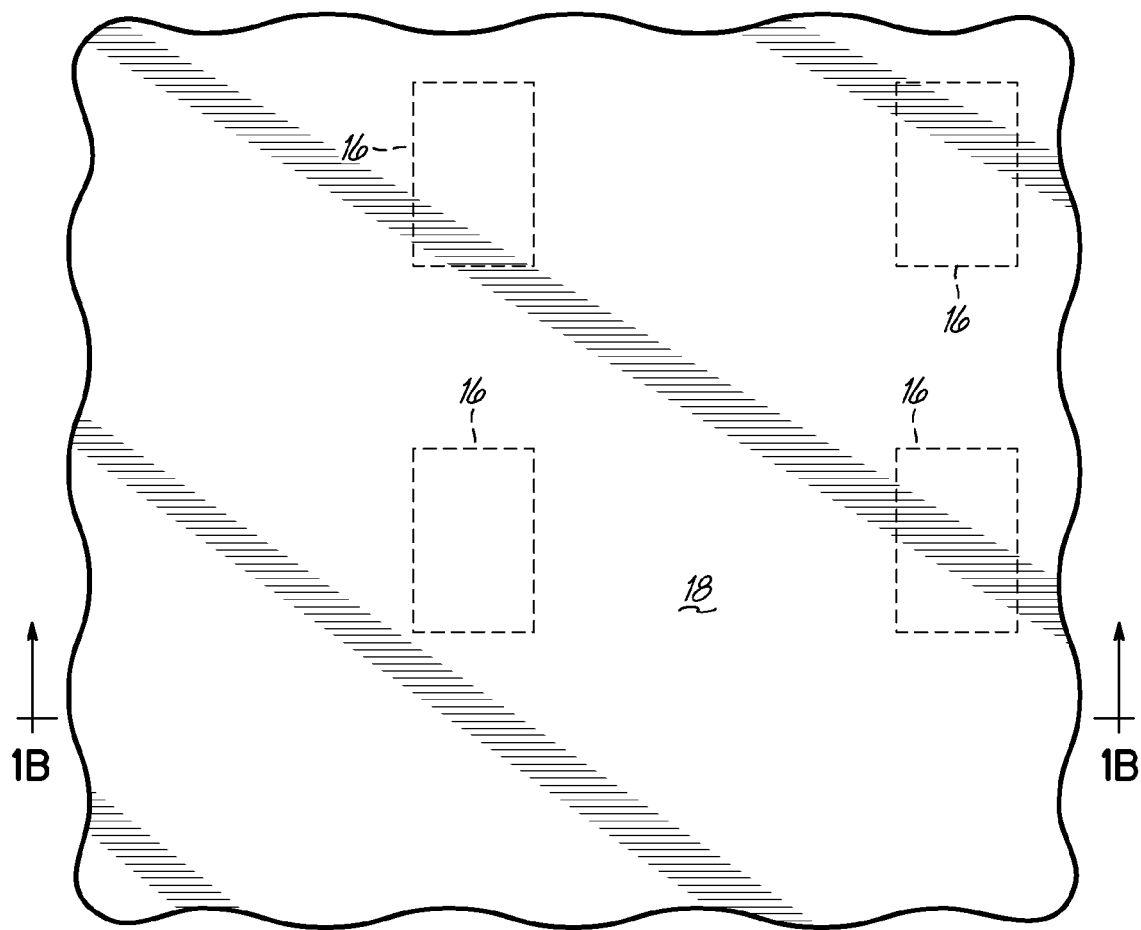
FIG. 1A is a top view of a portion of a substrate.
Figure 1B:
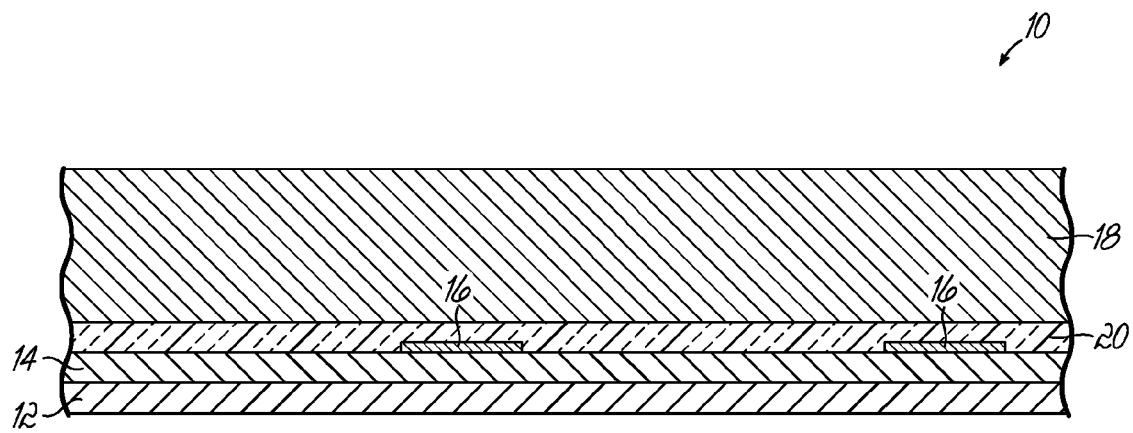
FIG. 1B is a cross-sectional view taken generally along lines 1B-1B in FIG. 1A.
Figure 9A:
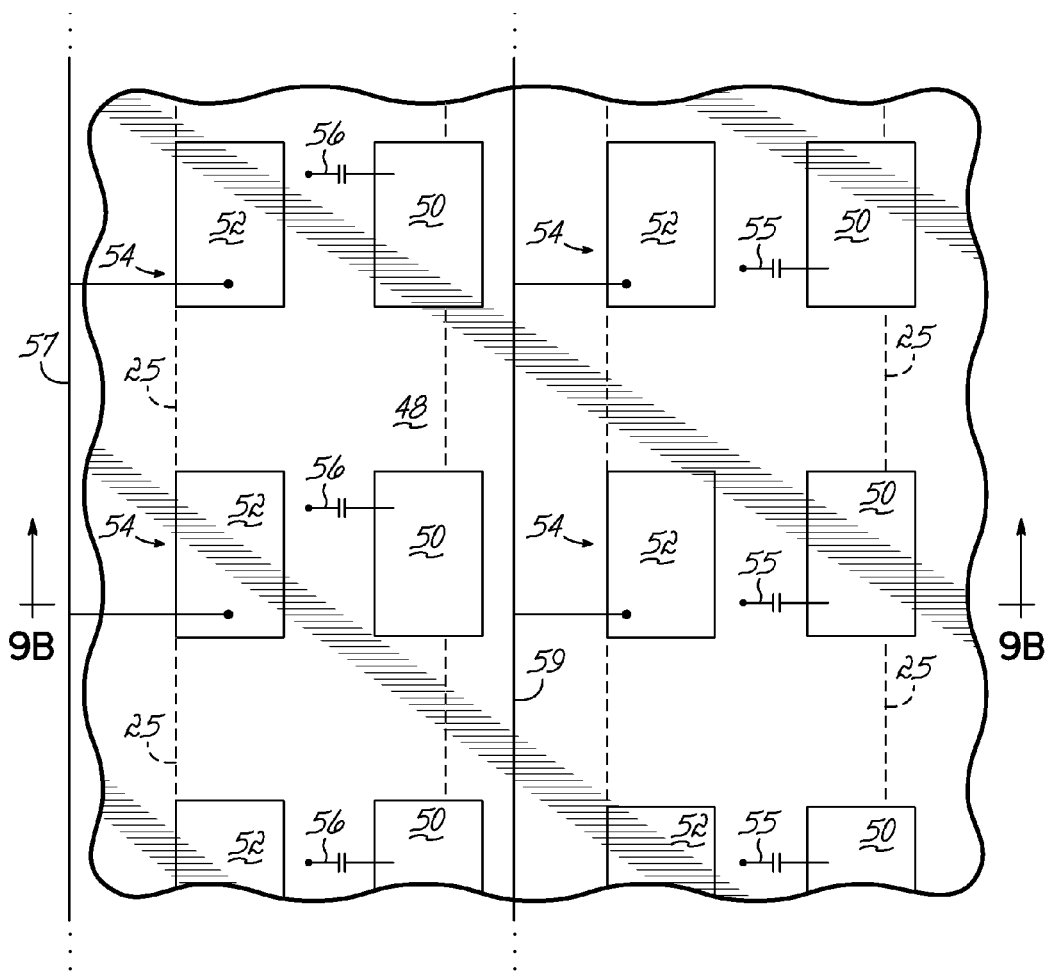
FIG. 9A is a top view similar to FIG. 8A at a subsequent fabrication stage.
Figure 9B:
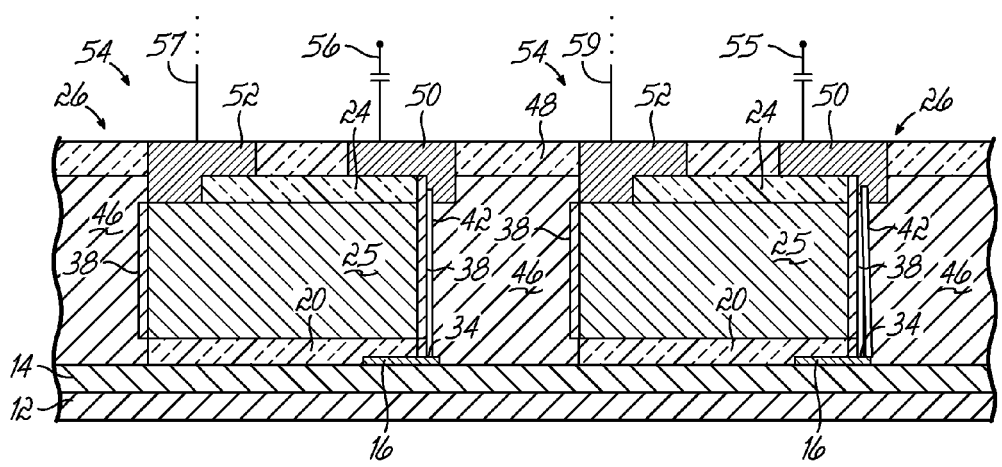
FIG. 9B is a cross-sectional view taken generally along lines 9B-9B in FIG. 9A.

With reference to FIGS. 1A and 1B, a layer stack 10 is formed on a substrate 12 covered by multiple parallel rows or stripes of a conductive layer 14 composed of a conducting material that participates in a source/drain connection in the completed device structure 54 (FIGS. 9A and 9B). Substrate 12 may be composed of any suitable substrate material, including but not limited to silicon (Si), gallium arsenide (GaAs), glasses, silicon carbide (SiC), and silicon dioxide ($SiO_2$). If substrate 12 is composed of a conducting material, then it must be covered by an insulating material (not shown) so that the discrete device structures 54 are not shorted together after fabrication. The layer stack 10 includes a patterned layer of catalyst pads 16 separated from a gate conductor 18 by an insulating layer 20. The gate conductor 18 consists of a blanket layer of a conductive material, such as highly-doped polycrystalline silicon (polysilicon) deposited by a low pressure chemical vapor deposition (LPCVD) process. The insulating layer 20 is formed from a thin film of an insulating material, such as $SiO_2$, silicon nitride ($Si_3N_4$) or silicon oxynitride ($SiO_xN_y$), deposited by any suitable conventional deposition technique. The material forming substrate 12, conductive layer 14 and gate conductor 18 do not catalyze synthesis of carbon nanotubes.

The catalyst pads 16 are formed by depositing a blanket layer of the catalytic material by any conventional deposition technique including, but not limited to, a chemical vapor deposition (CVD) process using suitable precursors such as metal halides and metal carbonyls, sputtering, and physical vapor deposition (PVD), and then employing a standard lithographic and subtractive etch process to pattern the blanket layer. Catalyst pads 16, which are electrically conducting, are positioned so that the stripes of conductive layer 14 are not shorted to one other. The catalytic material in catalyst pads 16 is any material capable of nucleating and supporting the synthesis or growth of semiconducting carbon nanotubes when exposed to appropriate reactants under chemical reaction conditions suitable to promote nanotube growth. Suitable catalytic materials for catalyst pads 16 include, but are not limited to, iron, nickel, cobalt, compounds of these metals such as metal oxides and metal silicides, and alloys of these metals. In the case of metal oxides, it may be necessary to perform a reduction to access or activate the catalyst material. The catalyst material or a material alloyed with the catalyst material, such as transition metals, potassium, rubidium, or arsenic pentafluoride ($AsF_5$), may also be capable of selectively diffusing from catalyst pad 16 into synthesized semiconducting carbon nanotubes 42 (FIGS. 7A and 7B), under appropriate conditions, for increasing the electrical conductivity of the diffused region, as explained below.

References herein to terms such as "vertical", "horizontal", etc. are made by way of example, and not by way of limitation, to establish a frame of reference. The term "horizontal" as used herein is defined as a plane parallel to the conventional plane or surface of substrate 12, regardless of orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed without departing from the spirit and scope of the invention.

Figure 2A:
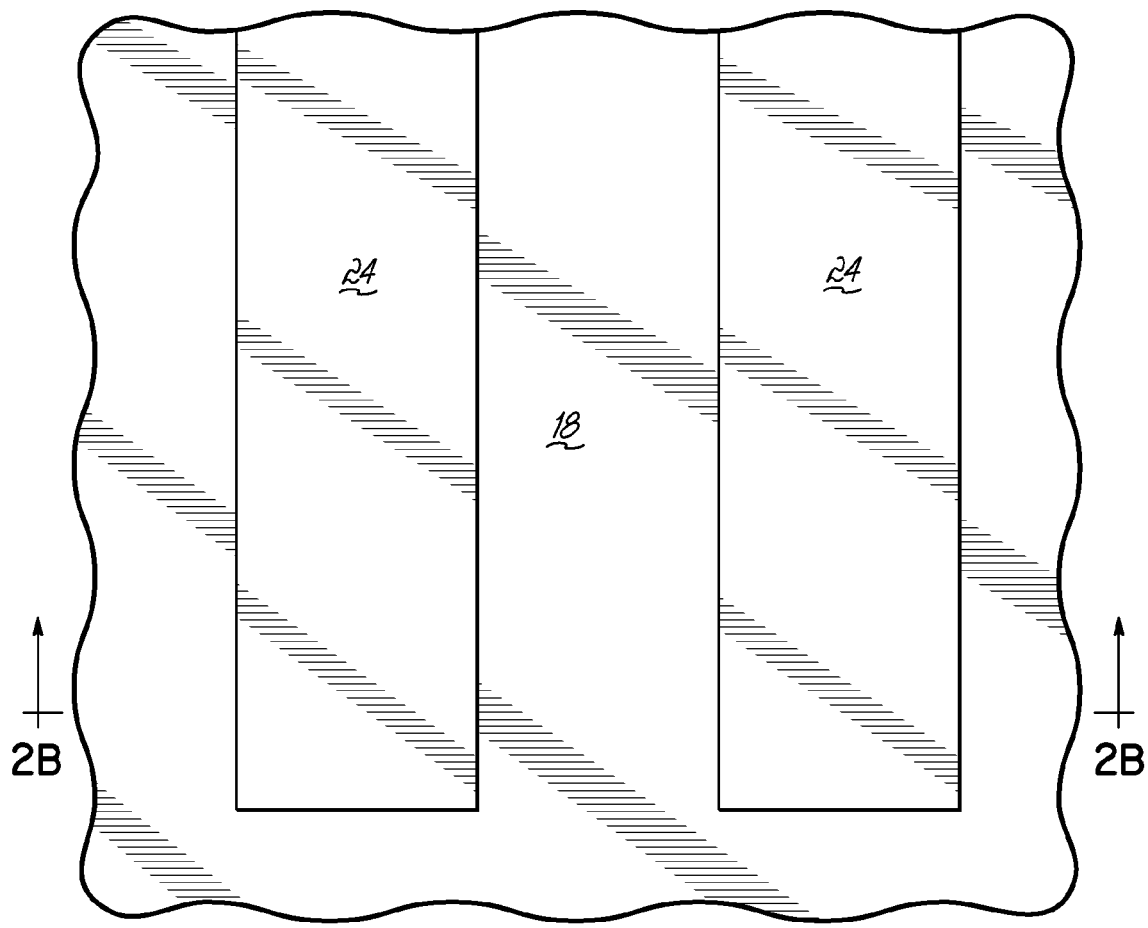
FIG. 2A is a top view of the substrate of FIG. 1A at a subsequent fabrication stage.
Figure 2B:
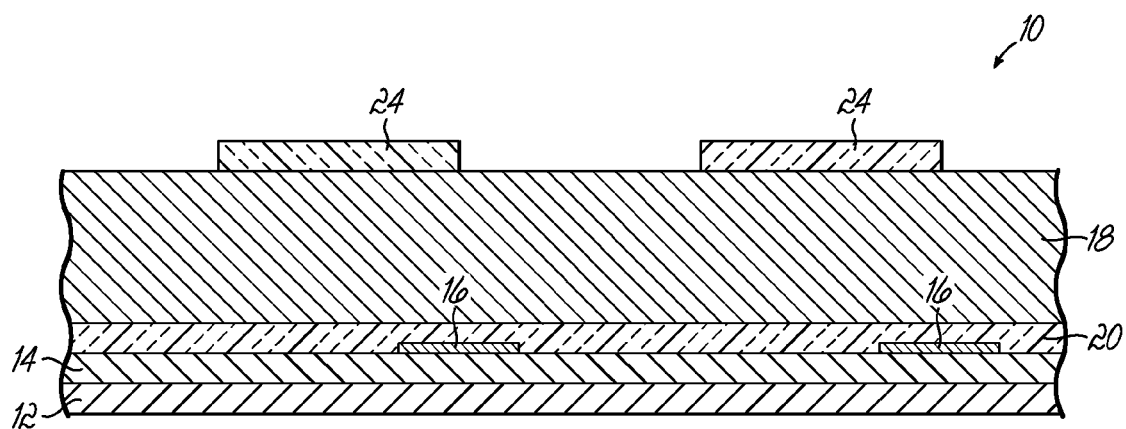
FIG. 2B is a cross-sectional view taken generally along lines 2B-2B in FIG. 2A.

With reference to FIGS. 2A and 2B in which like reference numerals refer to like features in FIGS. 1A and 1B and at a subsequent fabrication stage, an insulating layer 24 is deposited on the gate conductor 18 and patterned by a standard lithographic and etch process. The insulating layer 24 is formed of a thin film of an insulating material, such as $SiO_2$, $Si_3N_4$ or $SiO_xN_y$, that does not catalyze synthesis of carbon nanotubes. Insulating layer 24 may be deposited by any suitable conventional deposition technique. Insulating layers 20 and 24 should be thin for optimizing device performance.

Figure 3A:
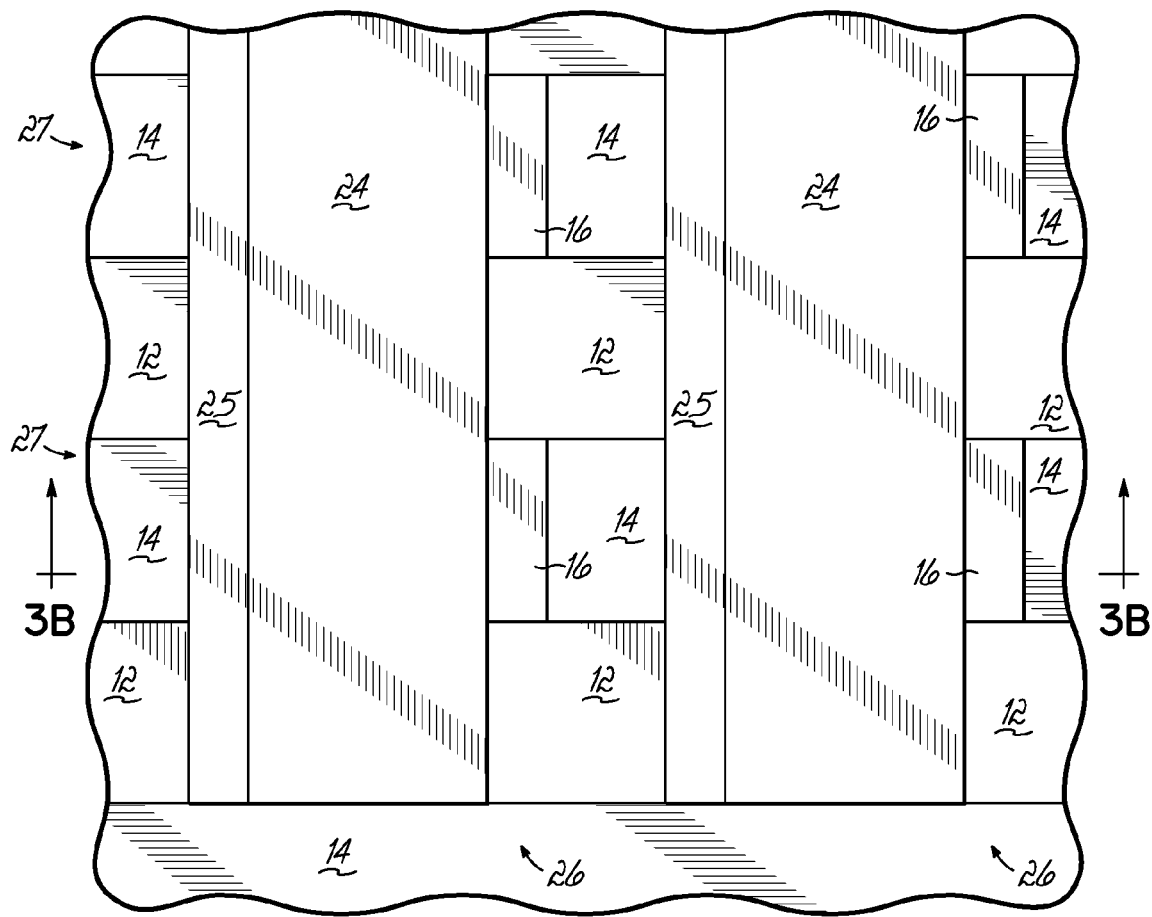
FIG. 3A is a top view similar to FIG. 2A at a subsequent fabrication stage.
Figure 3B:
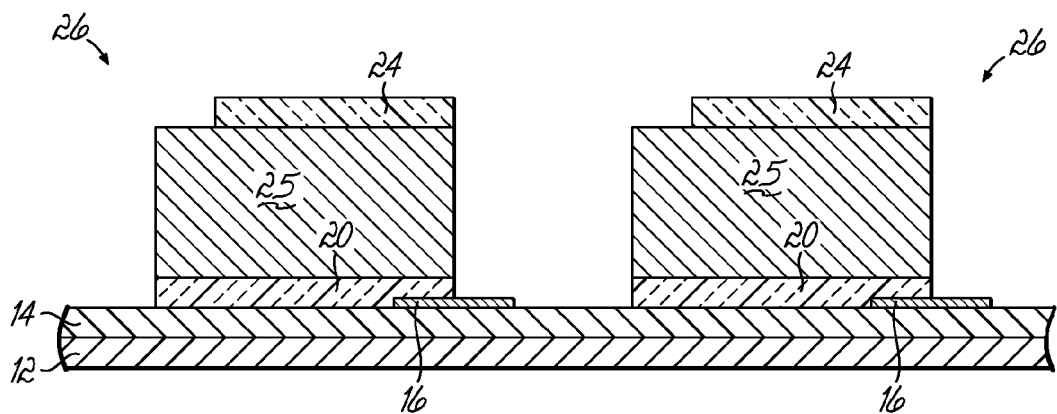
FIG. 3B is a cross-sectional view taken generally along lines 3B-3B in FIG. 3A.

With reference to FIGS. 3A and 3B in which like reference numerals refer to like features in FIGS. 2A and 2B and at a subsequent fabrication stage, the layer stack 10 (FIGS. 2A and 2B) is patterned to form an array of substantially identical, parallel columnar gate electrodes 25 running orthogonally to the stripes of conductive layer 14 that cooperate to define a rectangular grid of device structures 54 (FIGS. 9A and 9B). To that end, vertically-aligned portions of the insulating layer 24 and the gate conductor 18 are removed by a standard lithographic and etch process that also exposes regions of the catalyst pads 16 and conductive layer 14. Insulating layer 20 electrically isolates each gate electrode 25 from the conductive layer 14. In a memory application, each of the gate electrodes 25 defines a word line 26 for selecting all device structures 54 in a corresponding column of device structures 54. Although only two gate electrodes 25 are shown in FIGS. 3A and 3B, the invention is not so limited, as any number of gate electrodes 25 may be defined in gate conductor 18 to comply with a specific circuit design.

Adjacent stripes of the conductive layer 14 are each separated by one of multiple parallel stripes of insulating layer 12, which are exposed when portions of the insulating layer 20 and gate conductor 18 are removed. The stripes of conductive layer 14 define bit lines 27 for selecting all device structures 54 in a corresponding row of device structures 54. The word lines 26 and bit lines 27 are interfaced with suitable circuitry (not shown) to read or address a specific device structure 54 at the intersection of a selected word line 26 and a selected bit line 27. Hence, an array of memory device structures 54 is defined in accordance with this embodiment of the invention.

Figure 4A:
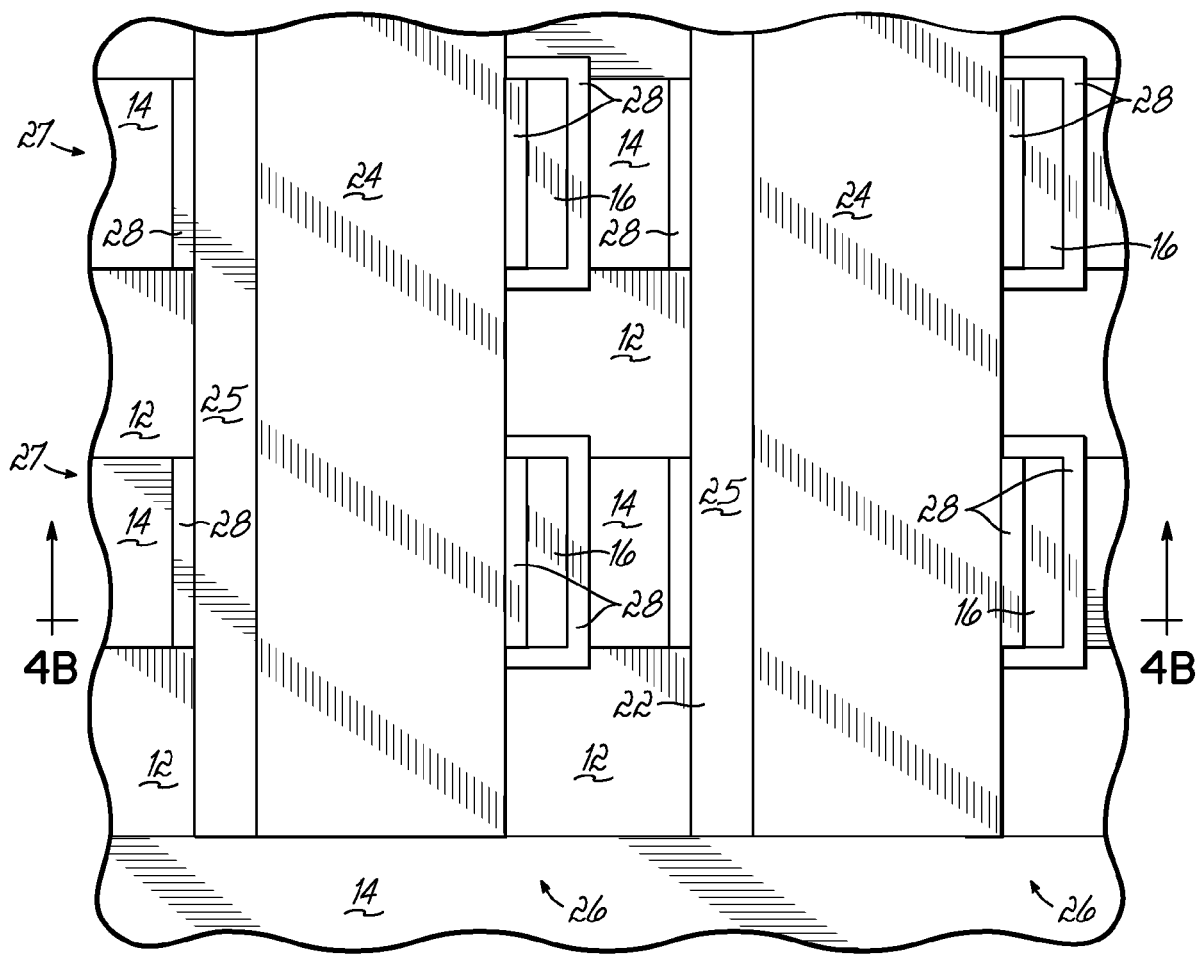
FIG. 4A is a top view similar to FIG. 3A at a subsequent fabrication stage.
Figure 4B:
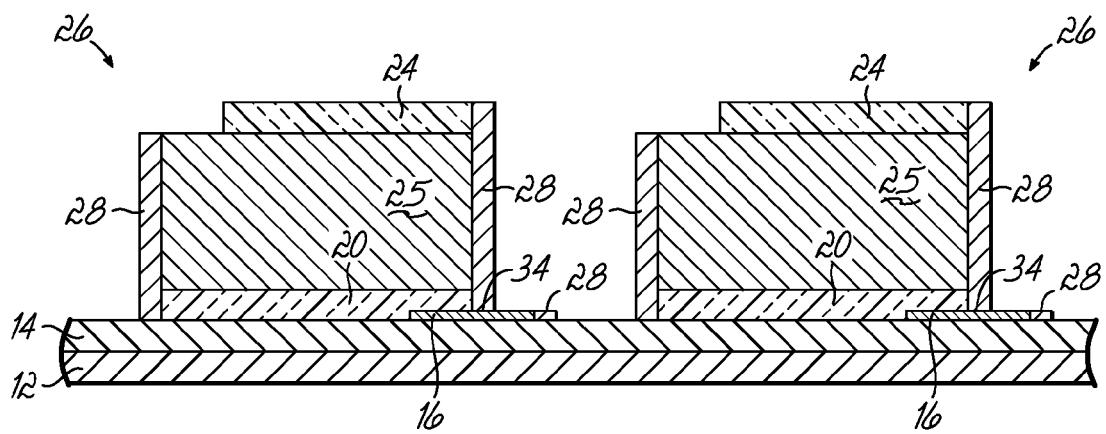
FIG. 4B is a cross-sectional view taken generally along lines 4B-4B in FIG. 4A.

With reference to FIGS. 4A and 4B in which like reference numerals refer to like features in FIGS. 3A and 3B and at a subsequent fabrication stage, a temporary spacer 28, which may be composed of $SiO_2$ or $SiO_xN_y$, is formed that covers the vertical surfaces of catalyst pads 16, insulating layer 20, and the gate electrodes 25. The thickness or width of temporary spacer 28 determines, after etching, a catalyst site or active area 34 of each of the catalyst pads 16 that is eventually exposed to the reactant(s) for synthesizing carbon nanotubes. The size of the active area 34 is believed to be a factor in determining the dimensions of the semiconducting carbon nanotubes 42 (FIGS. 7A and 7B) synthesized thereon. In certain embodiments of the invention, the width of the active areas 34 is on the order of a few nanometers.

Figure 5A:
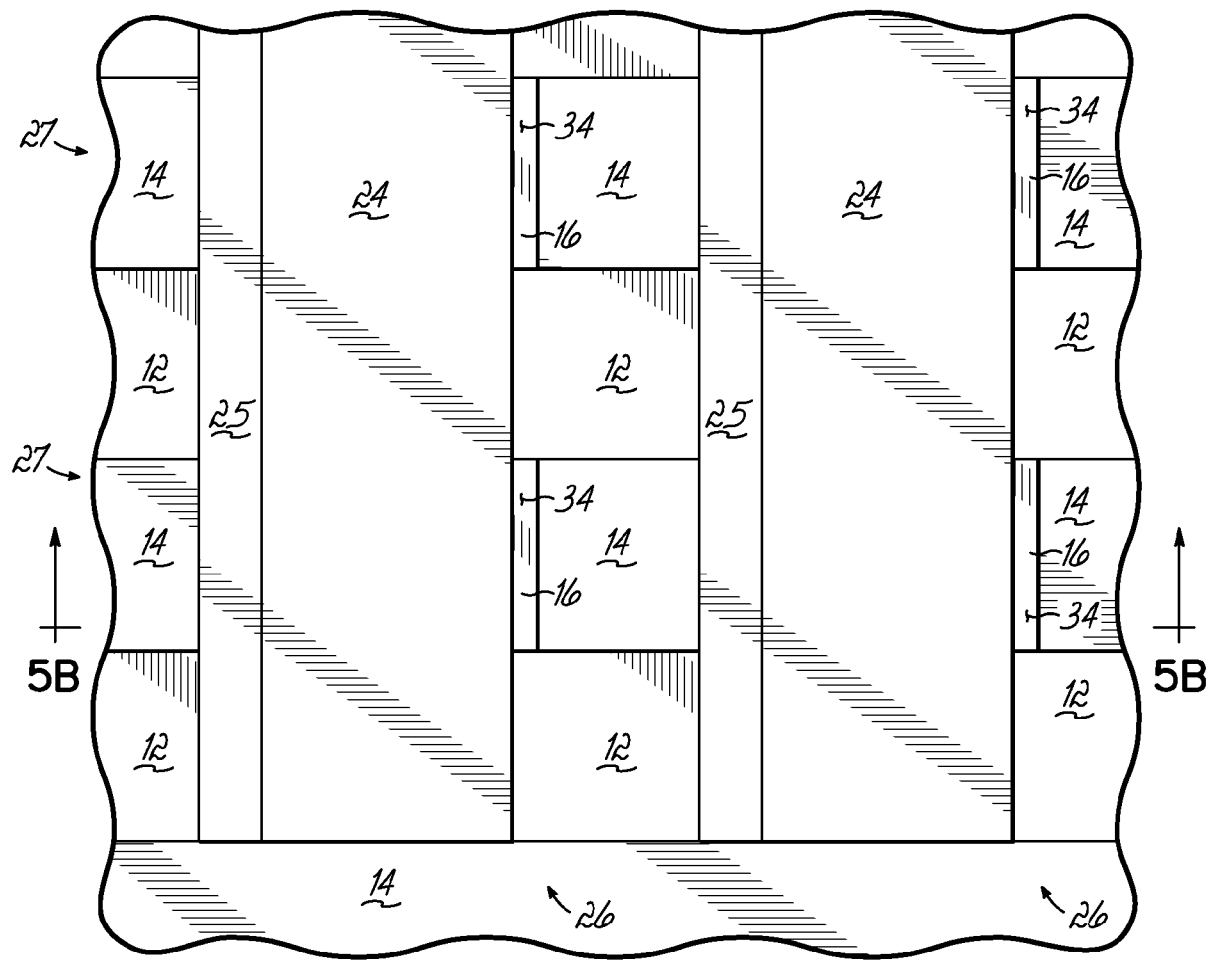
FIG. 5A is a top view similar to FIG. 4A at a subsequent fabrication stage.
Figure 5B:
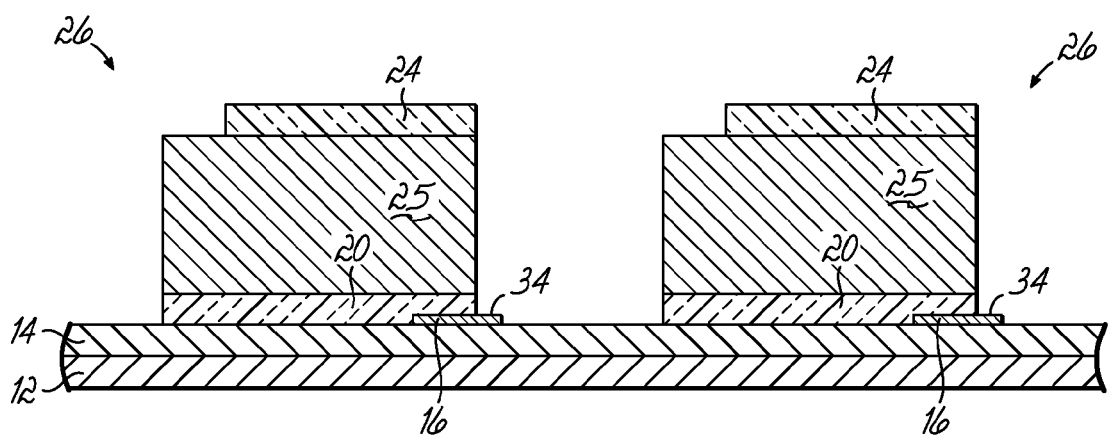
FIG. 5B is a cross-sectional view taken generally along lines 5B-5B in FIG. 5A.

With reference to FIGS. 5A and 5B in which like reference numerals refer to like features in FIGS. 4A and 4B and at a subsequent fabrication stage, the active areas 34 are defined by removing portions of the catalyst pads 16 not masked by the temporary spacer 28 using either a wet or dry etch process as understood by persons of ordinary skill in the art. Active areas 34 are revealed by removing the temporary spacer 28 with either a wet or dry etch process as understood by persons of ordinary skill in the art. Following the etch processes, the resultant structure includes an array of active areas 34 each having a desired feature size. One column of active areas 34 is aligned with each gate electrode 25.

In an alternative embodiment of the invention, the catalyst pads 16 are deposited with a monolayer thickness and annealed to create nanocrystals. The smaller nanocrystals may lead to the synthesis of smaller diameter nanotubes 42 (FIGS. 7A and 7B) and may favor the synthesis of single-wall carbon nanotubes 42.

Figure 6A:
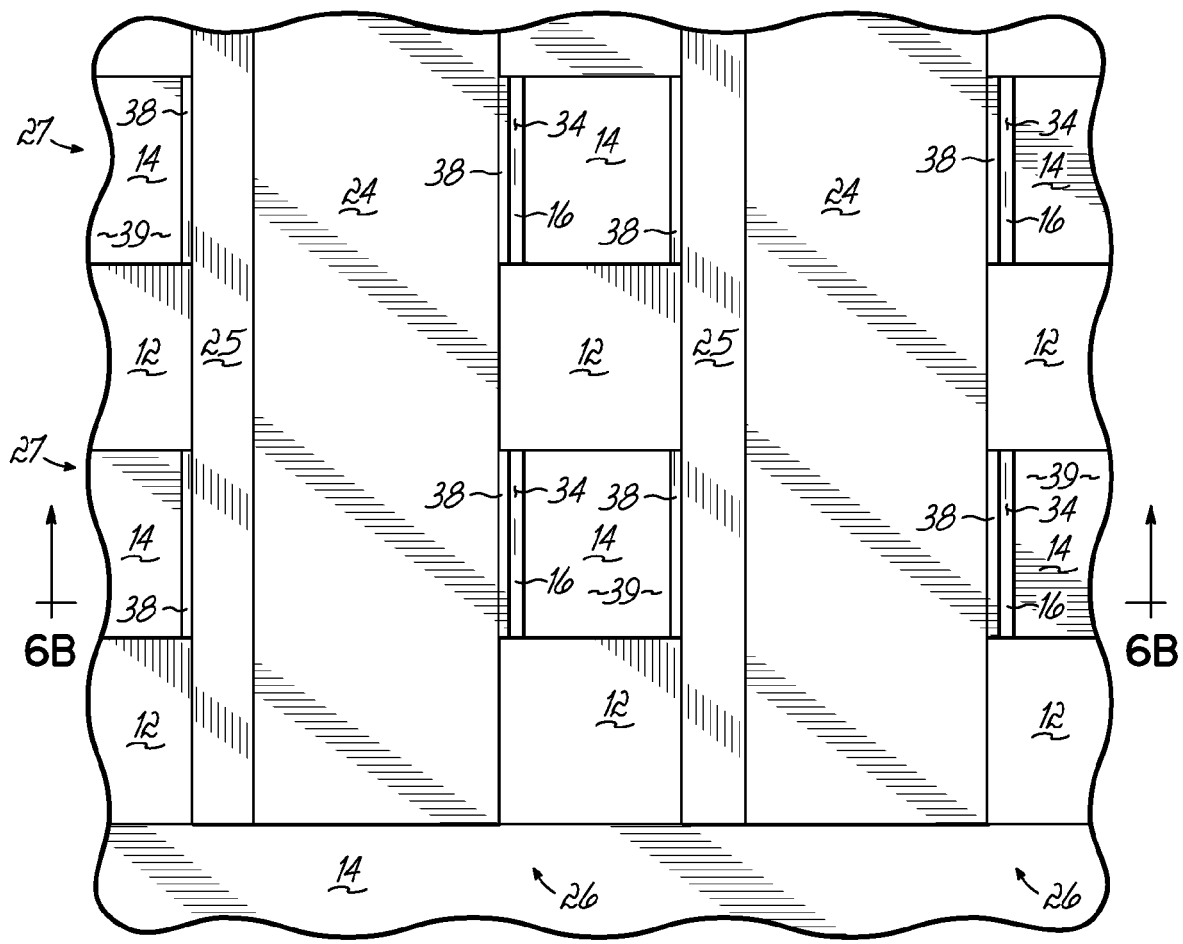
FIG. 6A is a top view similar to FIG. 5A at a subsequent fabrication stage.
Figure 6B:
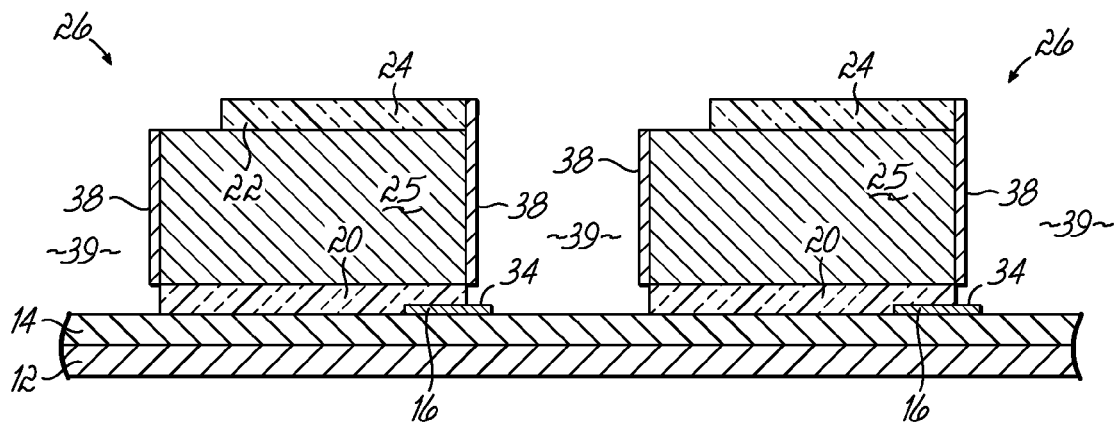
FIG. 6B is a cross-sectional view taken generally along lines 6B-6B in FIG. 6A.
Figure 10A:
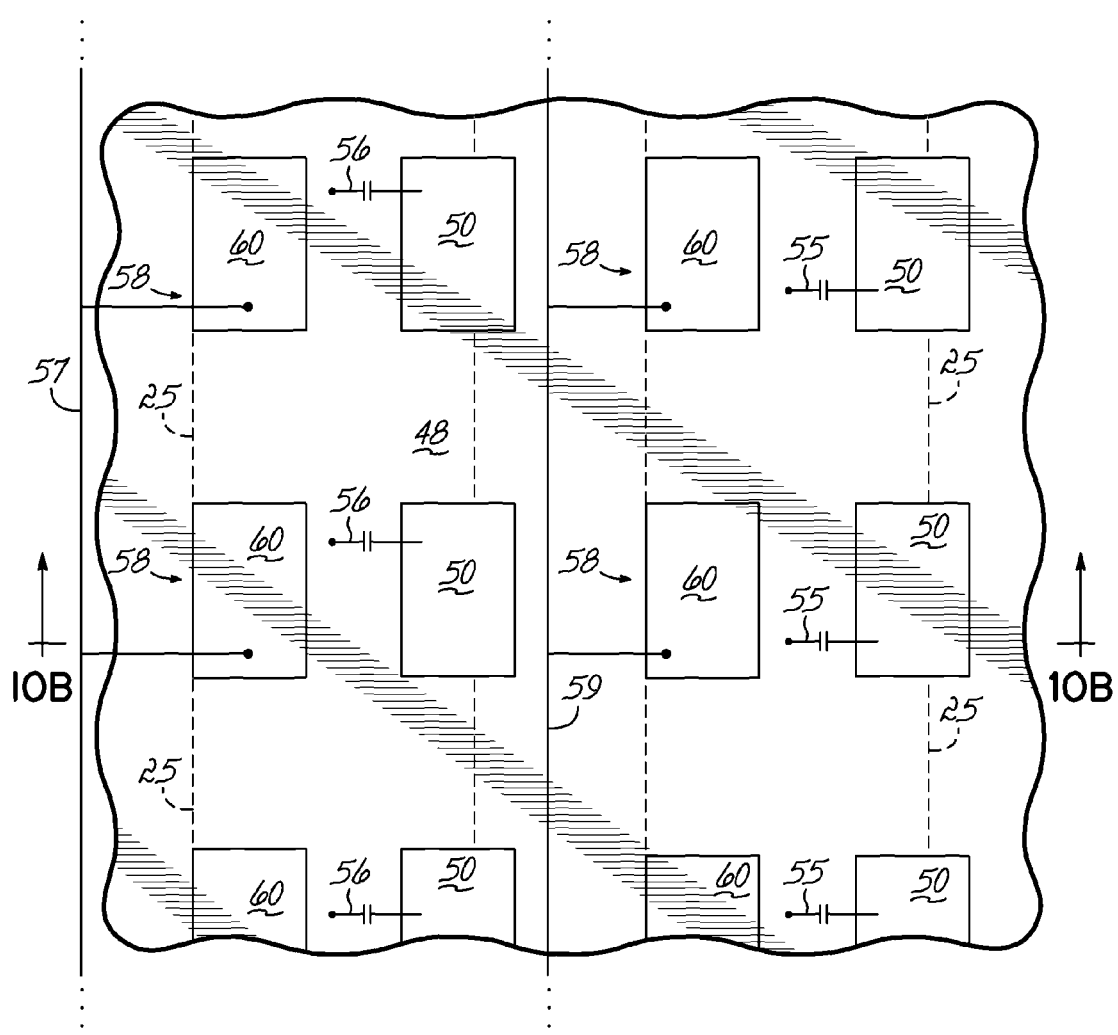
FIG. 10A is a top view similar to FIG. 9A of a device structure in accordance with an alternative embodiment of the invention.
Figure 10B:
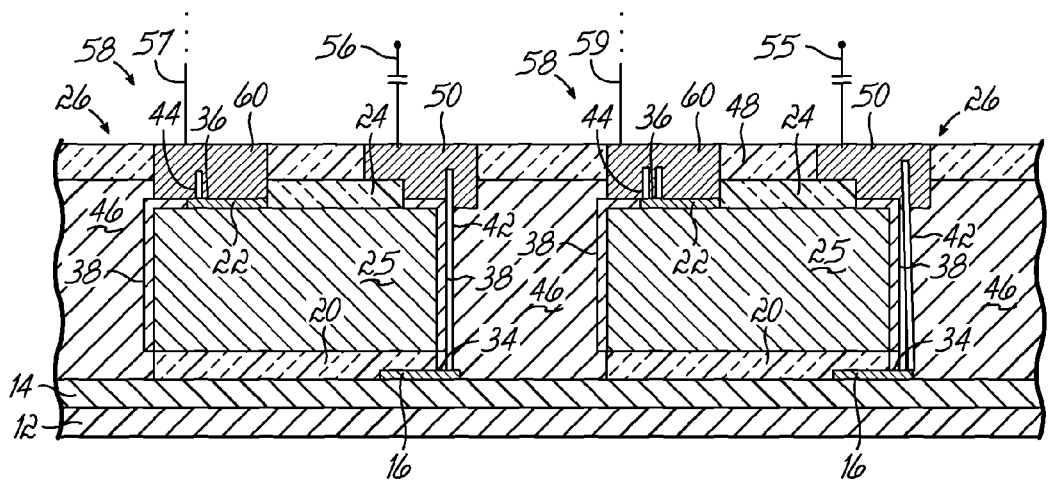
FIG. 10B is a cross-sectional view taken generally along lines 10B-10B in FIG. 10A.

With reference to FIGS. 6A and 6B in which like reference numerals refer to like features in FIGS. 5A and 5B and at a subsequent fabrication stage, an insulating layer 38 is applied to the vertical surfaces of each gate electrode 25. The insulating layer 38 may be composed of any suitable insulating or dielectric material, such as $SiO_2$ either grown by an oxidation process or deposited by a CVD process. The insulating layer 38 serves as a gate dielectric in the completed device structure 54 (FIGS. 10A and 10B). The word lines 26 are arranged as parallel columns and the bit lines 27 are arranged in parallel rows with adjacent word lines 26 separated by one of a corresponding plurality of open volumes or spaces 39 that supply reactant flow paths to the active areas 34. In certain embodiments of the invention, the ratio of the area defined by open spaces 39 to the total area viewed in a direction normal or perpendicular to substrate 12 is between about 20 percent and about 50 percent, preferably about 33 percent. The formation of insulating layer 38 may oxidize or otherwise inactivate the catalyst material forming active areas 34. The oxidized catalyst material may be reduced using hydrogen or forming gas at a temperature of about 300° C. to about 600° C., which is selected to avoid potentially reducing insulating layer 38.

Figure 7A:
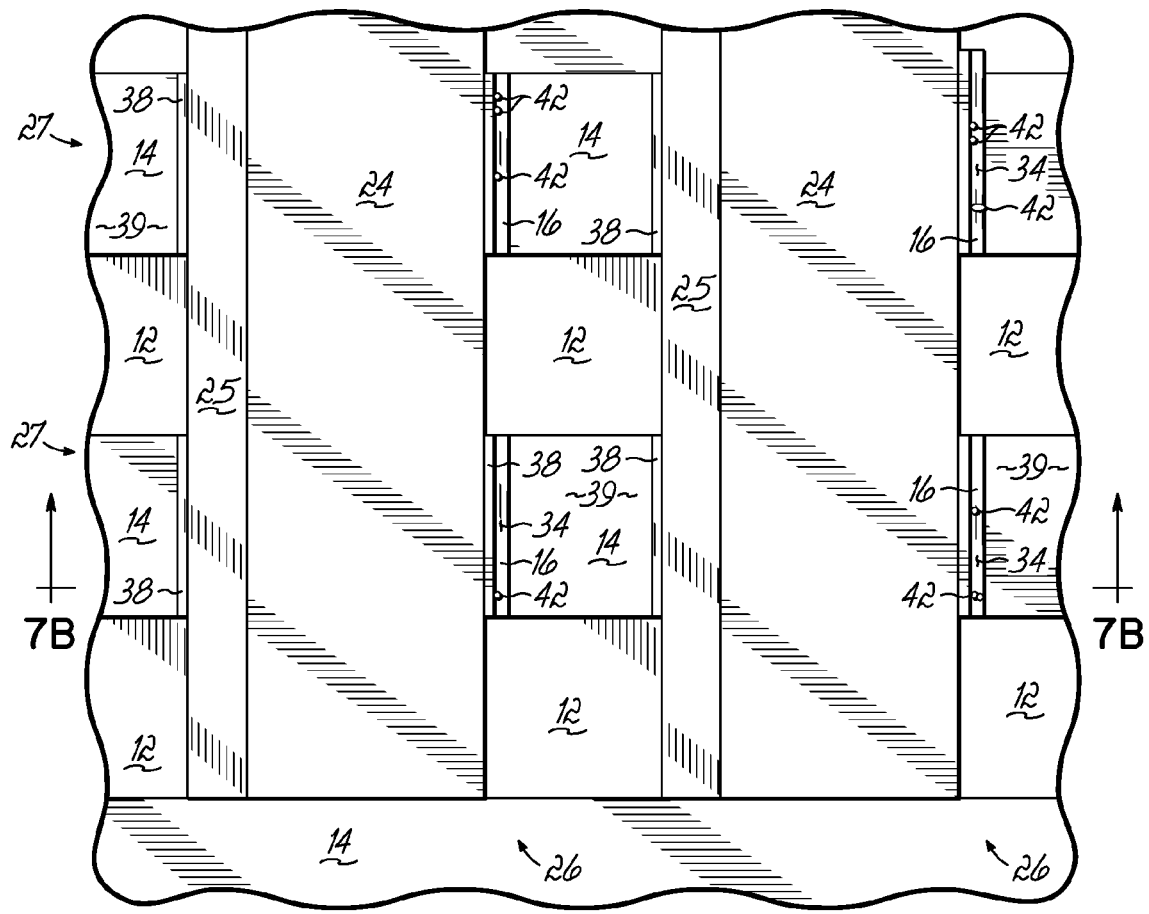
FIG. 7A is a top view similar to FIG. 6A at a subsequent fabrication stage.
Figure 7B:
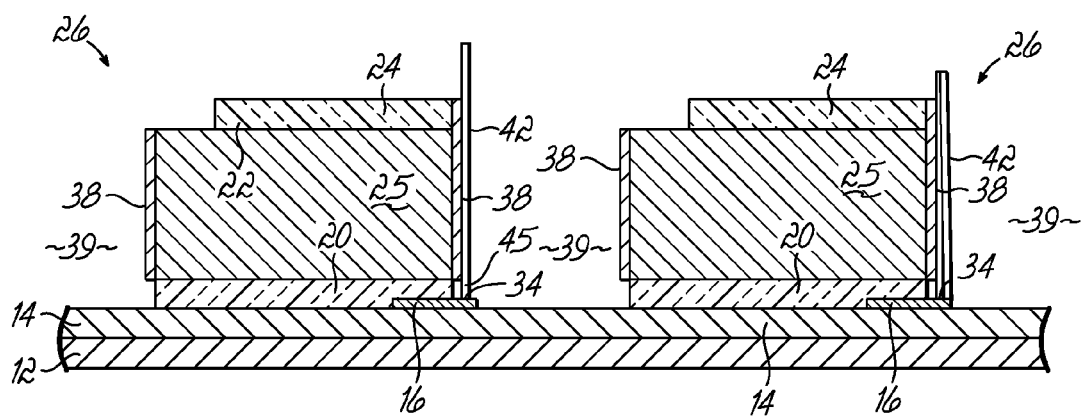
FIG. 7B is a cross-sectional view taken generally along lines 7B-7B in FIG. 7A.

With reference to FIGS. 7A and 7B in which like reference numerals refer to like features in FIGS. 6A and 6B and at a subsequent fabrication stage, carbon nanotubes 42 are grown or synthesized on active areas 34 by a CVD process. The length of the carbon nanotubes 42 is typically about 50 nm to about 500 nm, which corresponds approximately to the vertical height of the gate electrode 25. An optional spacer (not shown) may be applied about the vertical surfaces of the active areas 34 of catalyst pads 16 to eliminate nanotube synthesis from those vertical surfaces, which might potentially occlude the open spaces 39 and/or unwantedly create undesirable electrical connections by extending between adjacent word lines 26 or adjacent bit lines 27. If the conductive layer 14 exposed in open spaces 39 is composed of a conducting material that supports nanotube synthesis, a layer (not shown) of a temporary masking material must be applied to cover the exposed horizontal surfaces of conducting layer 14 during nanotube synthesis and then removed following nanotube synthesis.

Each active area 34 supports the synthesis of one or more semiconducting carbon nanotubes 42. In one embodiment of the invention, the nanotube synthesis conditions and reactant(s) and/or the types of catalyst material constituting catalyst pads 16 are chosen to selectively grow semiconducting carbon nanotubes 42 on active areas 34. Alternatively, semiconducting carbon nanotubes 42 on active areas 34 may be preferentially selected from among a collection of as-grown nanotubes 42 including both conducting and semiconducting molecular structures by, for example, applying a current sufficiently high to destroy nanotubes 42 having a conducting molecular structure. An exemplary approach for post-synthesis destruction of conducting carbon nanotubes is described in commonly-assigned U.S. Pat. No. 6,423,583, which is hereby incorporated by reference herein in its entirety.

Carbon nanotubes 42 constitute hollow cylindrical tubes of precisely arranged hexagonal rings of bonded carbon atoms having a structure characterized by a semiconducting electronic state. The cylindrical tubes may have a diameter ranging from about 0.5 nm to many nanometers as limited by the dimensions of the active area 34 and, if multi-wall, may have a sidewall thickness of several nanometers. The carbon nanotubes 42 may, without limitation, be multi-wall nanotubes resembling concentric cylinders or, alternatively, may constitute single-wall nanotubes.

The carbon nanotubes 42 extend upward from the corresponding active areas 34 with a vertical or, at the least, a substantially vertical orientation as the invention contemplates minor deviations from verticality (e.g., tilting) in growth direction may occur. The lengthening carbon nanotubes 42 will closely spatially follow or conform to the adjacent vertical surface of the gate electrode 25. The vertical directionality of nanotubes 42 is expected to be particularly evident for plasma enhanced CVD in which the nanotubes 42 may lengthen in the direction of an electric field present in the open spaces 39. Although not wishing to be bound by theory, it is believed that van der Waals forces will operate to attract the lengthening carbon nanotubes 42 to the vertical surface of the insulating layer 38.

The CVD process or plasma-enhanced CVD process synthesizing the carbon nanotubes 42 relies on any suitable gaseous or vaporized carbonaceous reactant(s) including, but not limited to, carbon monoxide (CO), ethylene ($C_2H_4$), methane ($CH_4$), acetylene ($C_2H_2$), xylene ($C_6H_4(CH_3)_2$), a mixture of $C_2H_2$ and ammonia ($NH_3$), a mixture of $C_2H_2$ and nitrogen ($N_2$), a mixture of $C_2H_2$ and hydrogen ($H_2$), and a mixture of ethanol ($C_2H_6O$) and $N_2$, supplied under growth conditions suitable for promoting carbon nanotube growth on the catalytic material forming the catalyst pads 16. Substrate 12 may be heated to a temperature adequate to promote and/or hasten CVD growth. The reactant(s) are delivered or supplied to each active area 34, where the reactant chemically reacts with the catalyst material to nucleate carbon nanotubes 42 and to sustain their growth following nucleation. In particular, the reactant(s) freely flow without significant flow constrictions in the volume defined by the open spaces 39 between word lines 26 to the active areas 34 for participating in the synthesis of semiconducting carbon nanotubes 42. Synthesis is expected to occur by addition of carbon atoms at an interface between each of the carbon nanotubes 42 and the corresponding active area 34. The catalyst material of the catalyst pads 16 participates in and promotes carbon nanotube synthesis without itself being transformed or consumed by the chemical reaction transpiring at its exposed surface by reducing the activation energy of the reaction forming semiconducting carbon nanotubes 42.

Either during nanotube synthesis or by a higher temperature thermal anneal after nanotube synthesis is completed and the reactant(s) are no longer present, atoms originating from the catalyst material or from a material alloyed with the catalyst material may be diffused into a region 45 of length of the semiconducting carbon nanotubes 42. The presence of the diffused species would increase the electrical conductivity of the semiconducting carbon nanotubes 42 in the diffused region 45 of length, which is preferably approximately equal to the thickness of insulating layer 20. Typically, the diffusion would be performed at a temperature higher than the temperature during nanotube synthesis, which controllably promotes diffusion only after the carbon nanotubes 42 are synthesized. In other words, the conduction-increasing species is not transferred from the active areas 34 of catalyst material into the carbon nanotubes 42 during synthesis, which might otherwise compromise the semiconducting properties of the nanotubes 42 for lengths of nanotubes 42 horizontally aligned with the gate electrode 25.

Figure 8A:
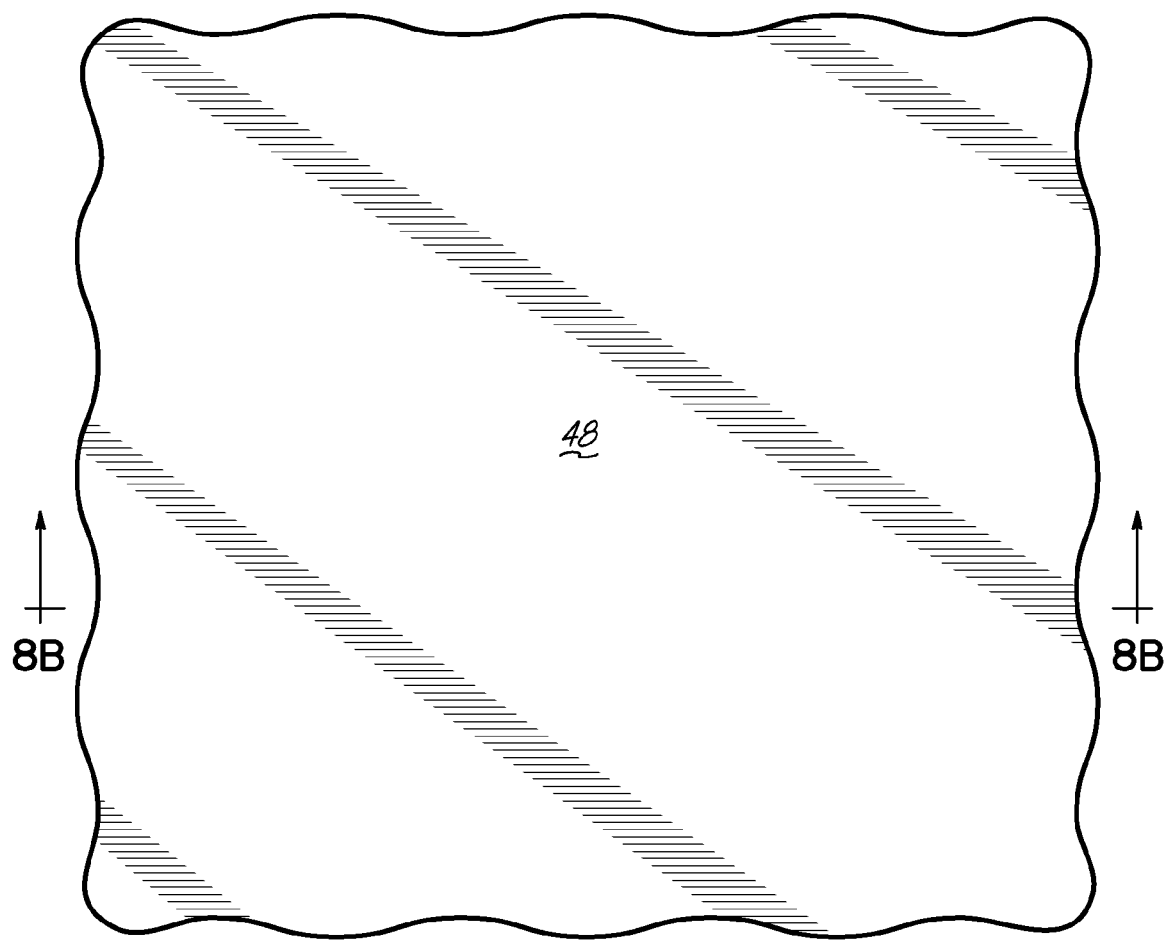
FIG. 8A is a top view similar to FIG. 7A at a subsequent fabrication stage.
Figure 8B:
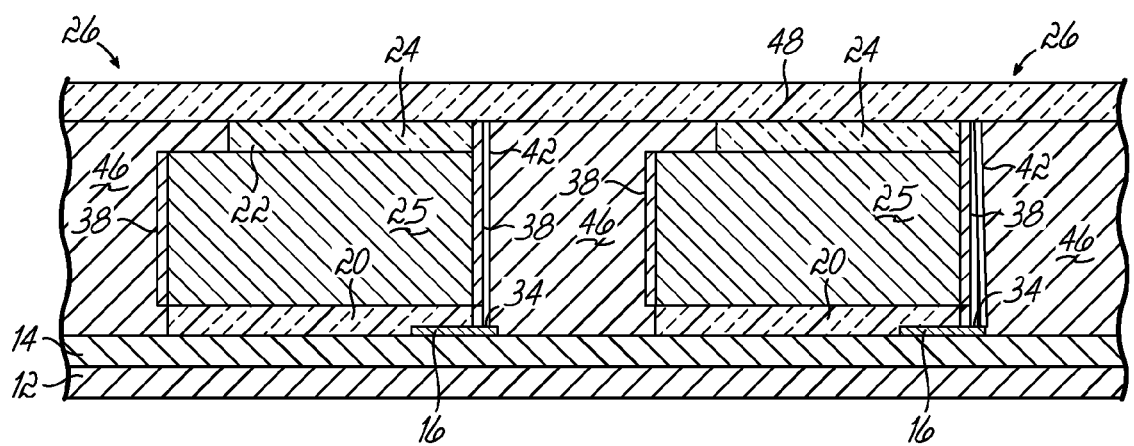
FIG. 8B is a cross-sectional view taken generally along lines 8B-8B in FIG. 8A.

With reference to FIGS. 8A and 8B in which like reference numerals refer to like features in FIGS. 7A and 7B and at a subsequent fabrication stage, a fill layer 46 of a dielectric material is conformally deposited by a conventional process to fill the open spaces 39 between adjacent word lines 26 and any spaces, if present, between adjacent semiconducting carbon nanotubes 42. The fill layer 46 may be, for example, $SiO_2$ deposited by a CVD process or a spin-on glass characterized by a low dielectric constant. Fill layer 46 stabilizes the position of the carbon nanotubes 42 either contacting or proximate to insulating layer 38. Fill layer 46 is polished flat by CMP or any other suitable planarization technique and another insulating layer 48, such as $SiO_2$, is deposited on planarized fill layer 46. The polishing removes fill layer 46 to a depth sufficient to also shorten lengthy nanotubes 42 projecting above the horizontal plane of an upper surface of insulating layer 24.

With reference to FIGS. 9A and 9B in which like reference numerals refer to like features in FIGS. 8A and 8B and at a subsequent fabrication stage, source/drain contacts 50 electrically coupled with the semiconducting carbon nanotubes 42 and gate contacts 52 electrically coupled with the gate electrode 25 are formed by defining contact openings in insulating layer 48 by a standard lithographic and etch process, optionally lining the contact openings with one or more barrier/adhesion enhancement layers (not shown), and blanket depositing a metal, such as tungsten, to fill the contact openings with metal plugs, and then removing the excess overburden of conductive material by any suitable planarization technique, such as CMP. The free ends or leading tips of certain of the carbon nanotubes 42 are exposed when the contact openings are etched and project vertically into the bulk of the corresponding contacts 50 after the contact openings are filled with corresponding metal plugs to form source/drain contacts 50.

The resultant structure is a memory circuit including memory device structures 54 arranged as an interconnected row and column array of field effect transistors each including a gate defined by gate electrode 25, source/drain contact 50, a second source/drain contact defined by catalyst pad 16 and the stripes of conductive layer 14, a gate dielectric defined by insulating layer 38, and a semiconducting channel region defined along the length of the semiconducting carbon nanotubes 42. Each completed device structure 54 is electrically coupled for operation in the memory circuit with other device structures 54 supported on adjacent regions of the substrate 12.

A plurality of capacitors 55 and a plurality of capacitors 56, shown diagrammatically in FIGS. 9A and 9B, are electrically coupled with drain contacts 50 in different word lines 26 for charge storage. This structure is described in more detail, for example, in S. Arai et al., IEEE IEDM 01-403 (2001), which is hereby incorporated by reference herein in its entirety. Current flows selectively from the catalyst pad 16 through the carbon nanotubes 42 for storing charge in the capacitor 56 when a sufficient electrical voltage is applied to an appropriate word line 26 from one of conductive lines 57, 59. The memory device structures 54 are electrically coupled by the stripes of conductive layer 14 (e.g., bit lines 27) and the gate electrodes 25 (e.g., word lines 26), which are used to read and write the binary state of the memory device structures 54.

With reference to FIGS. 10A and 10B in which like reference numerals refer to like features in FIGS. 1-9 and in accordance with an alternative embodiment of the invention, a memory device structure 58 includes a second patterned layer of catalyst pads 22 provided at a location generally overlying the gate conductor 18 (FIGS. 1A and 1B) and underlying the insulating layer 24 (FIGS. 2A and 2B) in the layer stack 10. The catalytic material constituting catalyst pads 22 is any electrically conducting material capable of nucleating and supporting the synthesis or growth of carbon nanotubes 44 when exposed to appropriate reactants under chemical reaction conditions suitable to promote nanotube growth. Suitable catalytic materials for catalyst pads 22 are described above with regard to catalyst pads 16. One or more carbon nanotubes 44, of which at least a fraction of multiple carbon nanotubes 44 have a structure characterized by a conducting electronic state, are grown or synthesized by a CVD growth process on catalyst pads 22. The synthesis conditions characterizing the CVD growth process may be modified to preferentially grow conducting carbon nanotubes 44. The length of carbon nanotubes 44 is typically about 10 nm to about 100 nm. Gate contacts 60, which replace gate contacts 52, are electrically coupled with the carbon nanotubes 44 and, hence, are electrically coupled with a corresponding one of gate electrodes 25.

In one embodiment of the invention, contact openings are defined in insulating layer 24, fill layer 46, and insulating layer 48 by a standard lithographic and etch process to expose the catalyst pads 22 subsequent to a fabrication stage corresponding to FIGS. 8A and 8B. The carbon nanotubes 44 are synthesized by the CVD growth process and the contact openings are filled with metal plugs to provide the gate contacts 60. The carbon nanotubes 44 project vertically into the bulk of the corresponding gate contacts 60 after the contact openings are filled with corresponding metal plugs.

Insulating layer 24 is shortened horizontally such that the vertical edge of the layer 24 is withdrawn from the vertical surface of gate electrode 25 overlying the active area 34. The reduced width of the insulating layer 24 also reduces the likelihood that a free end of bent carbon nanotubes 42 (FIGS. 8A and 8B) formed on catalyst pad 16 can contact a vertical surface of insulating layer 24 and thereby be spaced away from the vertical surface of the gate electrode 25.

Figure 11A:
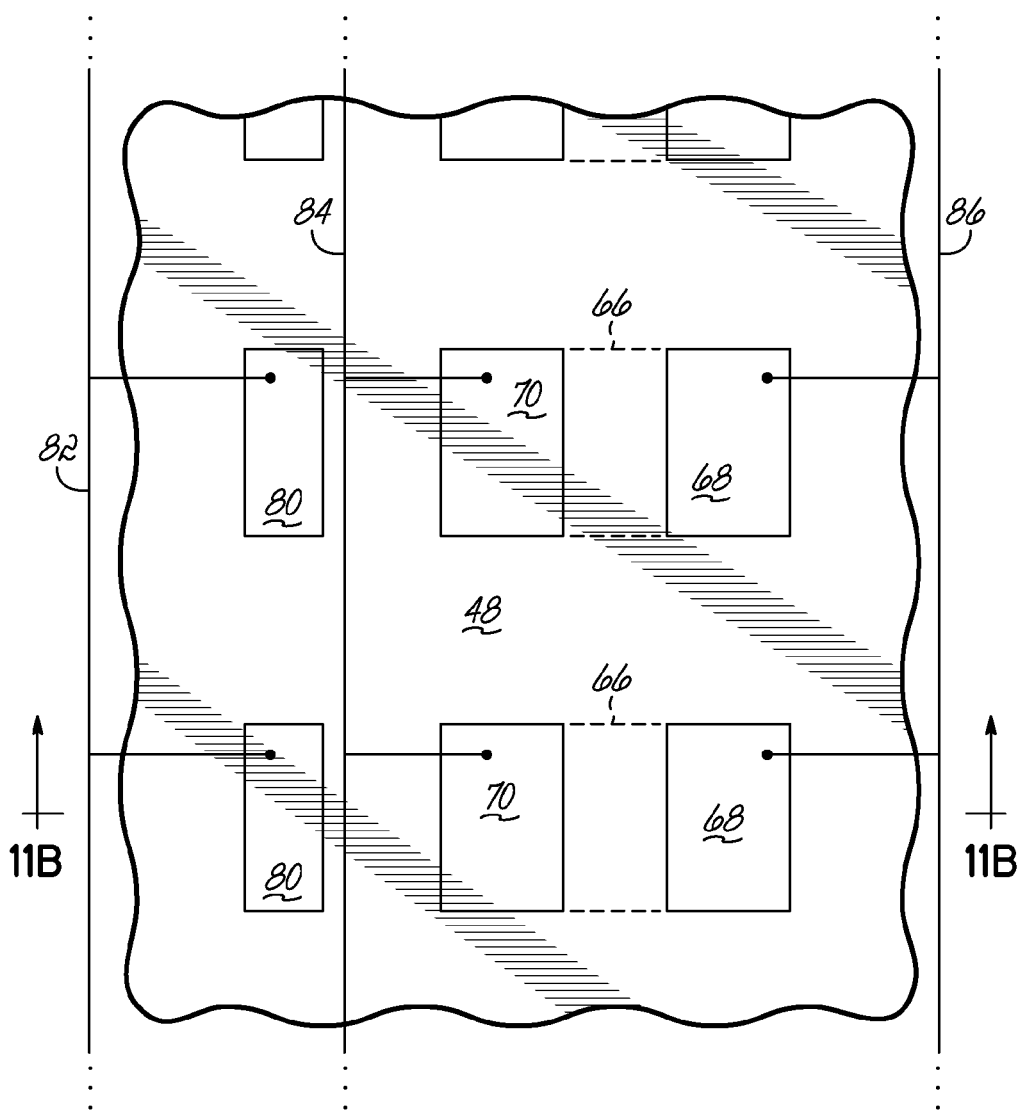
FIG. 11A is a top view similar to FIG. 10A of a device structure in accordance with an alternative embodiment of the invention.
Figure 11B:
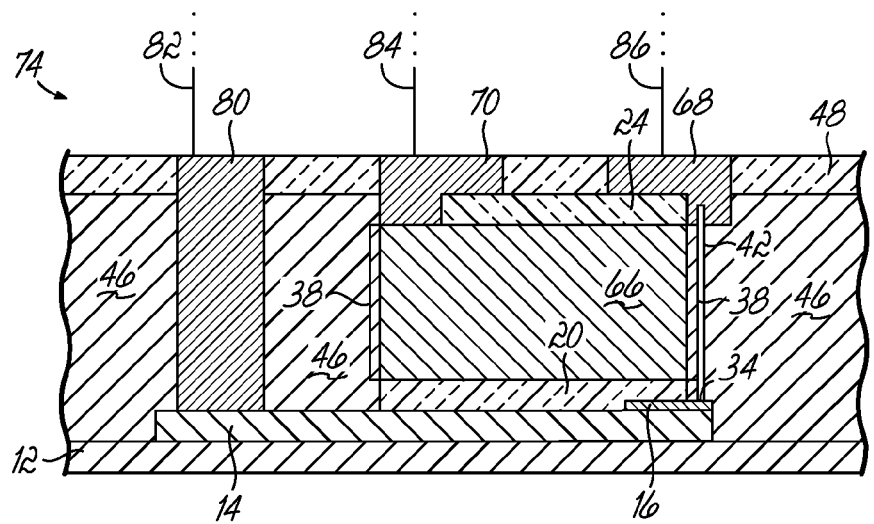
FIG. 11B is a cross-sectional view taken generally along lines 11B-11B in FIG. 11A.

With reference to FIGS. 11A and 11B in which like reference numerals refer to like features in FIGS. 1-10, conductive layer 14 of a logic device structure 74 is etched at a fabrication stage equivalent to the fabrication stage of FIGS. 1A and 1B to define discontinuities in the layer striping, which are ultimately filled with portions of fill layer 46. As a result and in cooperation with the striping of the conducting layer 14 visible in FIGS. 4A and 4B, adjacent device structures 74 are electrically isolated unless intentionally interconnected in the completed device structure to form a logic circuit. The semiconductor device structures 74 are constructed from layer stack 10 (FIGS. 2A and 2B) modified by patterning the gate conductor 18 using standard lithographic and etch processes to define an array of substantially identical gate electrodes 66 configured as spaced apart islands. The gate electrodes 66 are arranged as columns and rows of an array in which adjacent gate electrodes 66 are separated by one of a corresponding plurality of open spaces 39 that supply reactant flow paths to a corresponding one of the active areas 34 during growth of the semiconducting carbon nanotubes 42.

Source/drain contacts 68 electrically coupled with one end of the semiconducting carbon nanotubes 42, metal posts 80 electrically coupled with a conducting pad 76 to define a source connection via conducting layer 14 with an opposite end of the semiconducting carbon nanotubes 42, and gate contacts 70 electrically coupled with each gate electrode 66 are formed by standard lithographic and etch processes in insulating layer 48. One truncated stripe of conducting layer 14 extends horizontally beneath each gate electrode 66 from the corresponding metal post 80 to electrically couple with the associated catalyst pad 16. The truncated stripe of conducting layer 14, the catalyst pad 16 and the metal post 80 collectively form a second source/drain contact. Conductive metallization lines 82, 84, and 86 interconnect the source/drain contacts 68, the gate contacts 70 and the metal posts 80, respectively, for operation as a logic circuit as understood by persons of ordinary skill in the art.

Figure 12A:
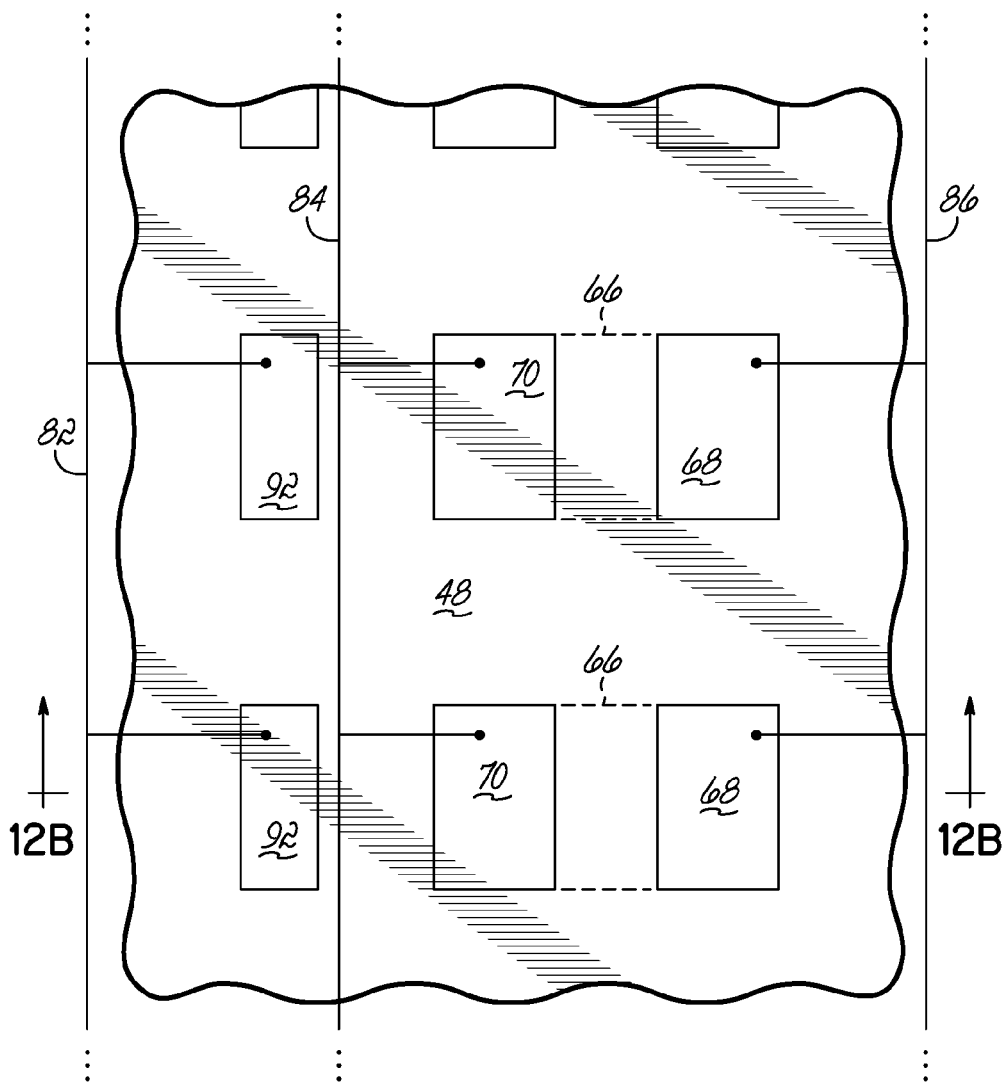
FIG. 12A is a top view similar to FIG. 11A of a device structure in accordance with an alternative embodiment of the invention.
Figure 12B:
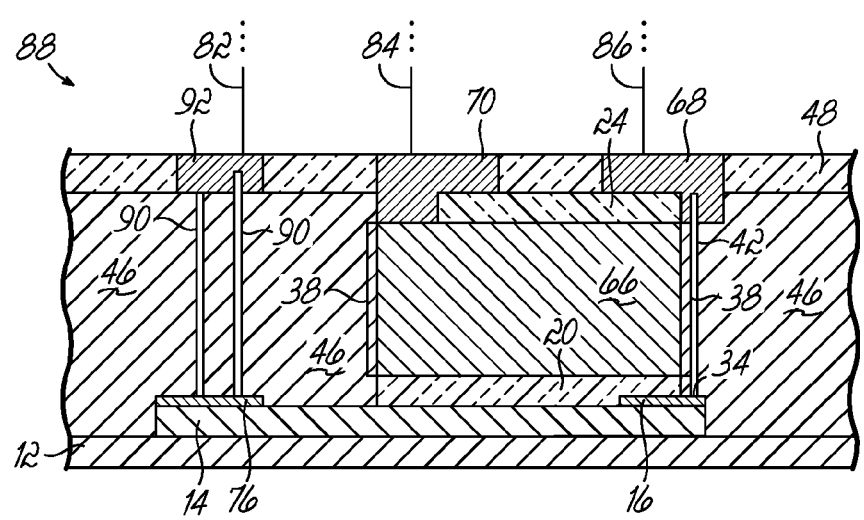
FIG. 12B is a cross-sectional view taken generally along lines 12B-12B in FIG. 12A.

With reference to FIGS. 12A and 12B in which like reference numerals refer to like features in FIGS. 11A and 11B and in accordance with an alternative embodiment of the invention, a logic device structure 88 further includes catalyst pads 76 each formed from a catalyst material capable of supporting the growth of at least one conducting carbon nanotube 90. Catalyst pads 76, which are electrically conducting, are introduced into layer stack 10 by the process forming catalyst pads 16. Carbon nanotubes 90, of which at least a fraction have a conducting electronic state, are synthesized at a fabrication stage corresponding to the fabrication stage of FIGS. 7A and 7B at which the semiconducting carbon nanotubes 42 and, optionally, carbon nanotubes 44 (FIGS. 10A and 10B) are synthesized. Source/drain contacts 92 formed by a standard lithographic and etch process in the insulating layer 48 are electrically coupled with the conducting carbon nanotubes 90. The free ends of the carbon nanotubes 90 extend into the bulk of the source/drain contacts 92. The source/drain contacts 68, the gate contacts 70 and the source/drain contacts 92 are interconnected by conductive metallization lines 82, 84, and 86, respectively, for operation as a logic circuit as understood by persons of ordinary skill in the art. The invention contemplates that the gate contacts 70 may be also formed partially by conducting carbon nanotubes (not shown but similar to carbon nanotubes 44 depicted in FIGS. 10A and 10B).

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method for fabricating a circuit on a substrate, the method comprising:
    forming a plurality of first catalyst pads in an array on a plurality of rows of a conducting material;
    forming a first insulating layer on the first catalyst pads and the plurality of rows of the conducting material;
    forming a gate electrode layer on the first insulating layer that is separated from the first catalyst pads and the plurality of rows of the conducting material by the first insulating layer;
    patterning the gate electrode layer and the first insulating layer to define a plurality of gate electrodes arranged in a plurality of parallel columns to define an array with the parallel rows of the conducting layer and to at least partially expose each of the first catalyst pads at a location proximate to a vertical sidewall of a respective one of the gate electrodes;
    directing a reactant to the plurality of first catalyst pads;
    synthesizing at least one semiconducting carbon nanotube on each of the plurality of first catalyst pads from the reactant by a chemical vapor deposition process;
    depositing a second insulating layer on the gate electrodes and the at least one semiconducting carbon nanotube on each of the plurality of first catalyst pads;
    planarizing the second insulating layer; and
    after the second insulating layer is planarized, forming a plurality of contacts each extending through the second insulating layer to be electrically coupled with a leading tip of the at least one semiconducting carbon nanotube on one of the first catalyst pads.

2. The method of claim 1 further comprising:
    forming a plurality of second catalyst pads on the gate electrode; and
    synthesizing at least one conducting carbon nanotube on each of the plurality of second catalyst pads.

3. The method of claim 1 further comprising :
    covering a first portion of each of the plurality of first catalyst pads with a mask; and
    etching a second portion of each of the plurality of first catalyst pads selective to the mask such that the first portion is unetched.

4. The method of claim 3 wherein the mask is a temporary spacer that is removed after etching.

5. The method of claim 1 further comprising:
electrically interconnecting the gate electrodes and the at least one semiconducting carbon nanotube on each of the plurality of first catalyst pads as a logic circuit.

6. The method of claim 1 further comprising:
electrically interconnecting the gate electrodes and the at least one semiconducting carbon nanotube on each of the plurality of first catalyst pads as a memory circuit with the parallel rows of the conductive layer serving as word lines and the parallel columns of the gate electrodes serving as bit lines.

7. The method of claim 1 further comprising:
diffusing material from each of the plurality of first catalyst pads into an adjacent region of the at least one semiconducting carbon nanotube thereon.

8. The method of claim 7 wherein the material is diffused into the adjacent region of the at least one semiconducting carbon nanotube after the at least one semiconducting carbon nanotube is synthesized on each of the plurality of first catalyst pads.

9. The method of claim 1 wherein the catalyst pads are formed from a layer composed of a catalytic material.

10. The method of claim 9 further comprising:
covering a first portion of each of the plurality of first catalyst pads with a mask; and
etching a second portion of each of the plurality of first catalyst pads selective to the mask such that the first portion is unetched.

11. The method of claim 10 wherein the mask is a temporary spacer that is removed after etching.

12. The method of claim 1 wherein a leading tip of the at least one semiconducting carbon nanotube on each of the first catalyst pads projects into a respective one of the contacts.

13. The method of claim 1 further comprising:
after the second insulating layer is planarized and before the contacts are formed, depositing a third insulating layer on the second insulating layer,
wherein the contacts further extend through the third insulating layer.

* * * * *